US012615953B2

(12) United States Patent
Yu

(10) Patent No.:  US 12,615,953 B2
(45) Date of Patent:      Apr. 28, 2026

(54) ARRAY SUBSTRATE AND DISPLAY PANEL

(71) Applicants:Chengdu BOE Optoelectronics Technology Co., Ltd., Chengdu (CN); BOE TECHNOLOGY GROUP CO., LTD., Beijing (CN)

(72) Inventor: Tiancheng Yu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 955 days.

(21) Appl. No.: 17/778,478

(22) PCT Filed: May 31, 2021

(86) PCT No.: PCT/CN2021/097170
§ 371 (c)(1),
(2) Date: Dec. 8, 2022

(87) PCT Pub. No.: WO2022/252001
PCT Pub. Date: Dec. 8, 2022

(65) Prior Publication Data
US 2024/0153932 A1      May 9, 2024

(51) Int. Cl.
*H10K 59/131*          (2023.01)
*H01L 25/16*           (2023.01)
(Continued)

(52) U.S. Cl.
CPC ........... *H10K 77/10* (2023.02); *H01L 25/167* (2013.01); *H10K 59/131* (2023.02); (Continued)

(58) Field of Classification Search
CPC .... H10K 77/10; H10K 59/131; H10K 59/353; H10K 59/80518; H10K 2102/3026; (Continued)

(56) References Cited

U.S. PATENT DOCUMENTS 9,583,548 B2 * 2/2017 Park ..................... H10K 59/131
10,388,222 B2 * 8/2019 Joo ....................... H10K 59/122
(Continued)

FOREIGN PATENT DOCUMENTS

CN       107819010 A      3/2018
CN       108461526 A      8/2018
(Continued)

*Primary Examiner* — Eduardo A Rodela
(74) *Attorney, Agent, or Firm* — HOUTTEMAN LAW LLC

(57)                ABSTRACT

An array substrate includes pixel regions each including at least one sub-pixel. The sub-pixel includes: a light-emitting unit and a signal line corresponding thereto. The signal line extends along a second direction. The light-emitting unit includes a first electrode. The pixel regions include first and second pixel regions adjacent to each other in a first direction. The at least one sub-pixel at least includes a sub-pixel of a first light-emitting color. Each sub-pixel includes a first area and a second area respectively on two sides of a virtual center line. The virtual center line passes through a center of the light-emitting unit in the first direction and extends along the second direction. In sub-pixels of the first light-emitting color of the first and second pixel regions, projections of signal lines on the base substrate fall into projections of the first and second areas on the base substrate, respectively.

18 Claims, 5 Drawing Sheets

(51) Int. Cl.

| | | |
|---|---|---|
| *H10K 59/35* | (2023.01) | |
| *H10K 77/10* | (2023.01) | |
| *H10K 59/80* | (2023.01) | |
| *H10K 102/00* | (2023.01) | |

(52) U.S. Cl.
CPC ..... *H10K 59/353* (2023.02); *H10K 59/80518* (2023.02); *H10K 2102/3026* (2023.02)

(58) Field of Classification Search
CPC ................. H10K 59/352; H10K 59/35; H10K 59/80516; H10K 59/82; H10K 59/878; H01L 25/167
See application file for complete search history.

(56) References Cited

U.S. PATENT DOCUMENTS

| | | | | |
|---|---|---|---|---|
| 10,453,909 | B2 * | 10/2019 | Li | H10K 59/124 |
| 10,573,699 | B2 * | 2/2020 | Park | H10K 59/1213 |
| 11,183,548 | B2 * | 11/2021 | Kwon | H10K 59/353 |
| 11,545,537 | B2 * | 1/2023 | Lee | H10K 59/131 |
| 11,574,984 | B2 * | 2/2023 | Seo | H10K 59/121 |
| 11,917,856 | B2 * | 2/2024 | Hwang | H10K 50/865 |
| 2011/0157110 | A1 * | 6/2011 | Chou | H10K 59/1315 |
| | | | | 345/80 |

| | | | | |
|---|---|---|---|---|
| 2015/0123081 | A1 * | 5/2015 | Huang | H10K 59/1315 |
| | | | | 257/40 |
| 2016/0266694 | A1 * | 9/2016 | Lee | G06F 3/04166 |
| 2017/0352312 | A1 * | 12/2017 | Ebisuno | H10K 59/131 |
| 2018/0205040 | A1 | 7/2018 | Kim et al. | |
| 2018/0261663 | A1 * | 9/2018 | Li | H10K 50/82 |
| 2023/0165083 | A1 * | 5/2023 | Park | H10K 59/131 |
| | | | | 257/40 |
| 2023/0180550 | A1 * | 6/2023 | Han | H10K 59/131 |
| | | | | 257/71 |
| 2023/0209927 | A1 * | 6/2023 | Jo | H10K 59/179 |
| | | | | 257/72 |
| 2023/0217712 | A1 * | 7/2023 | Lee | H10K 59/1216 |
| | | | | 257/40 |
| 2023/0217751 | A1 * | 7/2023 | Kim | H10K 59/80515 |
| | | | | 257/91 |

FOREIGN PATENT DOCUMENTS

| | | |
|---|---|---|
| CN | 108630733 A | 10/2018 |
| CN | 110610980 A | 12/2019 |
| CN | 112825345 A | 5/2021 |
| WO | 2021016947 A1 | 2/2021 |
| WO | 2021018301 A1 | 2/2021 |

* cited by examiner

ARRAY SUBSTRATE AND DISPLAY PANEL

CROSS-REFERENCE TO RELATED APPLICATIONS

This is a National Phase Application filed under 35 U.S.C. 371 as a national stage of PCT/CN2021/097170 filed on May 31, 2021, the content of which is incorporated herein by reference in its entirety.

TECHNICAL FIELD

The present disclosure belongs to the field of display technology, and in particular relates to an array substrate and a display panel.

BACKGROUND

Organic Light-Emitting Diode (OLED) devices are known as the most promising display devices due to their characteristics such as self-luminescence, high brightness, high contrast (or contrast ratio), low operating voltage, flexible display and the like. In an existing top-emission OLED display panel, as a view angle of a human eye increases, a brightness proportion of sub-pixels of different colors under a large view angle changes with the increase of the view angle. As a result, color coordinates of a white picture under a large view angle will deviate from color coordinates under a front view angle (e.g., a view angle of 0 degree), which in turn causes a color shift phenomenon under the large view angle. This color shift phenomenon is due to the structure of the OLED device itself, and is unavoidable in the current industry. In addition, monochromatic display and white light have an asymmetric phenomenon in luminance decay (i.e., brightness attenuation) trend under a large view angle, resulting in serious color asymmetry in a MOLED display product under a large view angle.

SUMMARY

Some embodiments of the present disclosure provide an array substrate and a display panel.

In a first aspect, embodiments of the present disclosure provide an array substrate, including a plurality of pixel regions each including at least one sub-pixel; the at least one sub-pixel each including: a light-emitting unit on a base substrate and a signal line corresponding to the light-emitting unit; the signal line extending along a second direction; the light-emitting unit including a first electrode; and the signal line being on a side of the first electrode proximal to the base substrate; where the plurality of pixel regions include at least one first pixel region and at least one second pixel region that are adjacent to each other along a first direction; the at least one sub-pixel at least includes a sub-pixel of a first light-emitting color;

each sub-pixel includes a first area and a second area respectively on two sides of a virtual center line thereof; the virtual center line passes through a center of the light-emitting unit in the first direction and extends along the second direction; the first area and the second area in every sub-pixel are arranged in the same manner;

in a sub-pixel of the first light-emitting color of the at least one first pixel region, at least a part of a projection of at least one signal line on the base substrate falls into a projection of the first area on the base substrate; and in a sub-pixel of the first light-emitting color of the at least one second pixel region, at least a part of a projection of at least one signal line on the base substrate falls into a projection of the second area on the base substrate.

In some embodiments, in a same sub-pixel, the projection of the signal line on the base substrate overlaps a projection of the light-emitting unit on the base substrate.

In some embodiments, the sub-pixel further includes a driving unit on the base substrate; in a same sub-pixel, the signal line is connected to the driving unit, and the driving unit is configured to drive the light-emitting unit to emit light.

In some embodiments, in a same sub-pixel, the first area and the second area are substantially symmetrical with respect to the virtual center line.

In some embodiments, signal lines of sub-pixels of the first light-emitting color of two adjacent pixel regions are arranged in a mirror-image manner with respect to a center of the two adjacent pixel regions.

In some embodiments, the light-emitting units of the sub-pixels of the first light-emitting color in the two adjacent pixel regions are arranged in a mirror-image manner with respect to the center of the two adjacent pixel regions.

In some embodiments, the plurality of pixel regions include a plurality of first pixel regions and a plurality of second pixel regions arranged along a first direction; and the plurality of first pixel regions and the plurality of second pixel regions are arranged alternately in the first direction.

In some embodiments, the plurality of pixel regions are arranged in an array;

in a row direction, at least one first pixel region is adjacent to at least one second pixel region; and pixel regions in one column are all first pixel regions or all second pixel regions.

In some embodiments, the plurality of pixel regions are arranged in an array;

in a row direction, at least one first pixel region is adjacent to at least one second pixel region; and in a column direction, at least one first pixel region is adjacent to at least one second pixel region.

In some embodiments, each pixel region includes a plurality of sub-pixels; and in a same pixel region, at least some of the plurality of sub-pixels have different light-emitting colors.

In some embodiments, the projections of the signal lines of the plurality of sub-pixels in a same pixel region on the base substrate fall into the projections of the first areas of the plurality of sub-pixels on the base substrate, respectively; or the projections of the signal lines of the plurality of sub-pixels in a same pixel region on the base substrate fall into the projections of the second areas of the plurality of sub-pixels on the base substrate, respectively.

In some embodiments, light-emitting colors of the plurality of sub-pixels include: one or more of red, green, and blue.

In some embodiments, a shape of a light-emitting area of each of at least some of the plurality of sub-pixels includes an axisymmetric pattern symmetrical with respect to the virtual center line.

In some embodiments, the shape of the light-emitting area of each sub-pixel includes at least one of a quadrangle, a pentagon, a hexagon, an octagon, a circle, and an ellipse.

In some embodiments, the light-emitting unit includes a top-emission OLED light-emitting device.

In some embodiments, the top-emission OLED light-emitting device includes: the first electrode, an organic light-emitting layer, and a second electrode arranged in sequence along a direction away from the base substrate, and a transflective structure on a side of the second electrode distal to the base substrate.

In some embodiments, the top-emission OLED light-emitting device further includes: a reflective structure on a side of the organic light-emitting layer proximal to the base substrate; and the reflective structure and the first electrode are of a single-piece structure.

In a second aspect, an embodiment of the present disclosure provides a display panel including any one of the array substrates as described above.

BRIEF DESCRIPTION OF DRAWINGS

The accompanying drawings, which are used to provide further understanding of the present disclosure and constitute a part of the specification, are used to explain the present disclosure together with the following detailed implementations, but not to limit the present disclosure. In the accompanying drawings.

DETAIL DESCRIPTION OF EMBODIMENTS

Figure 1:
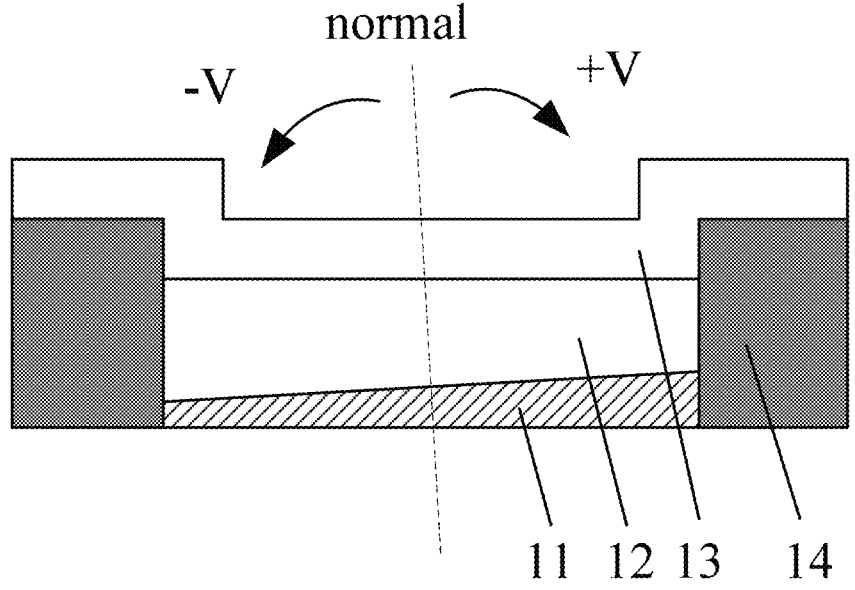
FIG. 1 is a schematic structural diagram of a sub-pixel in an array substrate according to an embodiment of the present disclosure.

In order to make the objective, technical solutions and advantages of the present disclosure clearer, the present disclosure will be further described in detail below with reference to the accompanying drawings. Obviously, embodiments described herein are only some, but not all, of the embodiments of the present disclosure. Based on the embodiments described in the present disclosure, all other embodiments obtained by those of ordinary skill in the art without creative efforts shall fall within the protection scope of the present disclosure.

Shapes and sizes of components in the accompanying drawings are not necessarily drawn to scale, and are only for facilitating understanding of contents of the embodiments of the present disclosure.

Unless otherwise defined, technical terms or scientific terms used in the present disclosure should have general meanings as understood by those of ordinary skill in the art to which the present disclosure belongs. The words "first", "second" and the like used in the present disclosure do not denote any order, quantity, or importance, but are merely used to distinguish different components from each other. Similarly, the word "a", "an", "the" or the like does not denote limitation on quantity, but denotes the presence of "at least one" element. The word "include", "comprise" or the like indicates that an element or object before the word covers an element or object listed after the word and equivalents thereof, but does not exclude other elements or objects. The word "connect", "couple" or the like is not restricted to physical or mechanical connection, but may include electrical connection, whether direct or indirect connection. The words "on", "under", "left", "right" and the like are merely used to indicate relative positional relationships, and when an absolute position of an object described is changed, the relative positional relationships may be changed accordingly.

Embodiments of the present disclosure are not limited to the embodiments shown in the accompanying drawings, but further include modifications of configurations formed based on manufacturing processes. Thus, regions illustrated in the accompanying drawings are for illustrative purpose, and shapes of the regions illustrated in the drawings illustrates specific shapes of regions of elements but are not intended to be restrictive.

In an array substrate, each pixel region is provided therein with at least one sub-pixel 1. A corresponding light-emitting unit may be controlled to emit light by transmitting a corresponding electrical signal to a signal line 2. By controlling a light-emitting color and light-emitting brightness of the sub-pixel 1 in every pixel region in the array substrate, display of different images can be realized.

Figure 2:
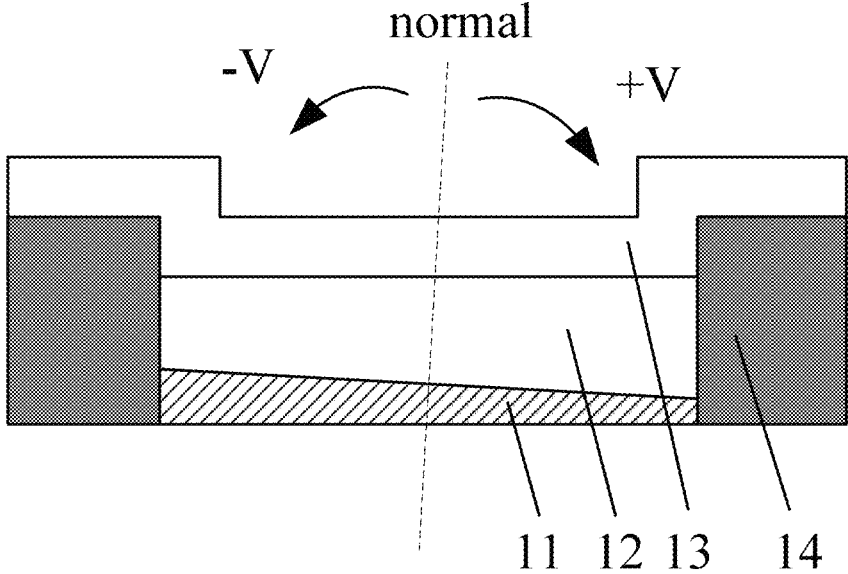
FIG. 2 is a schematic structural diagram of a sub-pixel in an array substrate according to an embodiment of the present disclosure.

The light-emitting unit of the sub-pixel 1 may include an OLED (which may also be referred to as an OLED light-emitting device). In an embodiment, the OLED includes a first electrode 11, a second electrode 13, and an organic light-emitting layer located therebetween. In a case where the array substrate emits light from a single side (e.g., from a side of the second electrode 13), the side of the second electrode 13 may be provided with a transflective structure, and a side of the first electrode 11 may be provided with a reflective structure. In light emitted by the organic light-emitting layer 12, part of the light is directly emitted out through the transflective structure, and part of the light is reflected to the reflective structure and then emitted out after being reflected again. The part of light that is reflected again and the part of light that is directly emitted out are superimposed on each other and emitted out. That is, the light-emitting unit may be regarded as an optical interference cavity. Although under a front view angle, display of a white picture may be achieved by Gamma regulation, and white balance can be adjusted and controlled by adjusting a brightness proportion of RGB. However, with the increase of a view angle of a human eye, the optical interference cavities of sub-pixels 1 of different colors have different structures, so the brightness proportion of the sub-pixels 1 of different colors under a large view angle changes with the increase of the view angle. As a result, color coordinates of a white picture under a large view angle will deviate from color coordinates under a front view angle, resulting in a color shift phenomenon under the large view angle. In the sub-pixel 1, the light-emitting unit is located above the signal line 2 (at a side relatively far away from a base substrate). When fabricating the array substrate, the signal line 2 is formed before forming the light-emitting unit. Although a planarization layer is usually provided between the signal line 2 and the light-emitting unit, the presence of the signal line 2 still affects flatness of a layer structure of the light-emitting unit. In some embodiments, a via hole is provided in the planarization layer, and the signal line 2 is electrically connected to the first electrode 11 of the light-emitting unit through the via hole. A via hole configured to connect the signal line 2 to other structure is located at a center of an area where the sub-pixel 1 is located, so that the entire signal line 2 cannot be provided in a middle area of the sub-pixel 1, but beside the center. Referring to FIG. 1 and FIG. 2, in a case where the signal line 2 is located right to the center of the sub-pixel 1, a surface of the first electrode 11 of the light-emitting unit may have an inclined morphology that is low on the left and high on the right, with a normal whose direction is in a −V direction; in a case where the signal line 2 is located on a left part of the first electrode 11, and the surface of the first electrode may have an inclined morphology that is high on the left and low on the right, with a normal whose direction is in the +V direction. In this case, when all sub-pixels 1 in the array substrate adopts either of the above two schemes, a phenomenon of asymmetrical color shift trajectory at large view angles on the left and right sides will occur.

In order to solve the above problems, embodiments of the present disclosure provide an array substrate, which is described in the following for details.

In a first aspect, referring to FIG. 1 to FIG. 11 FIG. 10, embodiments provide an array substrate, and the array substrate includes a plurality of pixel regions. At least one sub-pixel 1 is included in each pixel region. The at least one sub-pixel 1 each includes: a light-emitting unit disposed on a base substrate and a signal line 2 corresponding to the light-emitting unit. The signal line 2 extends along a second direction. The light-emitting unit includes a first electrode 11. The signal line 2 is located on a side of the first electrode 11 proximal to the base substrate, and is electrically connected to the first electrode 11. The plurality of pixel regions include at least one first pixel region A and at least one second pixel region B that are arranged adjacently (i.e., adjacent to each other) along a first direction. The at least one sub-pixel 1 includes at least a sub-pixel of a first light-emitting color. Each sub-pixel 1 includes a first area and a second area respectively located on two sides of a virtual center line. The virtual center line passes through a center of the light-emitting unit in the first direction (i.e., the center is a midpoint of the light-emitting unit in the first direction) and extends along the second direction. The first area and the second area in every sub-pixel 1 are arranged in the same manner. In a sub-pixel of the first light-emitting color in the at least one first pixel region A, at least a part of a projection of at least one signal line 2 on the base substrate falls within a projection of the first area on the base substrate; and in a sub-pixel of the first light-emitting color in the at least one second pixel region B, at least a part of a projection of at least one signal line 2 on the base substrate falls within a projection of the second area on the base substrate.

In the array substrate provided by the embodiments of the present disclosure, along the direction of the signal line 2 in the sub-pixel 1, the virtual center line is established and passes through the center point of the light-emitting unit, and the first area and the second area of each sub-pixel 1 are respectively located on two sides of the virtual center line. At the same time, the first areas of different sub-pixels 1 are all located on a first side (e.g., left side in FIG. 3 and FIG. 4) of the respective virtual center lines of the sub-pixels 1, and the second areas thereof are all located on a second side (e.g., right side in FIG. 3 and FIG. 4) of the respective virtual center lines of the sub-pixels 1. It should be noted that, in order to clearly illustrate the embodiments of the present disclosure, the following description is given by taking a case where the first area is located on the left side of the virtual center line of the sub-pixel 1, and the second area is located on the right side of the virtual center line of the sub-pixel 1 as an example.

In the embodiments, the pixel regions are distinguished from each other by different areas in which the signal lines 2 in the sub-pixels of the first light-emitting color are located. Specifically, when the projection of the signal line 2 in a sub-pixel of the first light-emitting color on the base substrate falls into the projection of the first area of the sub-pixel of the first light-emitting color on the base substrate, the pixel region where the sub-pixel of the first light-emitting color is located is the first pixel region A; when the projection of the signal line 2 in a sub-pixel of the first light-emitting color on the base substrate falls into the projection of the second area of the sub-pixel of the first light-emitting color on the base substrate, the pixel region where the sub-pixel of the first light-emitting color is located is the second pixel region B. That is to say, for sub-pixels 1 of a same light-emitting color (e.g., the sub-pixels 1 of the first light-emitting color), the signal lines 2 in sub-pixels 1 belonging to different pixel regions are located in different areas, respectively, i.e., either in the first area or in the second area. In a case where the signal line 2 in a sub-pixel 1 is located in the first area, the first electrode 11 of the light-emitting unit of the sub-pixel 1 has a surface having an inclined morphology, which is high in the first area and low in the second area, and a rate of L-Decay (luminance decay) in the +V direction is significantly faster than that in the −V direction. In a case where the signal line 2 in a sub-pixel 1 is located in the second area, the first electrode 11 of the light-emitting unit of the sub-pixel 1 has a surface having an inclined morphology, which is low in the first area and high in the second area, and the rate of L-Decay in the −V direction is significantly faster than that in the +V direction. With the design of different positions of the signal lines 2 of the sub-pixels 1 of a same light-emitting color in different pixel regions, color shifts of light respectively emitted by the sub-pixels of the same light-emitting color in different pixel regions can be complemented under a large view angle in a same direction, so as to overall reduce color shift asymmetry during image display of the array substrate.

Figure 3:
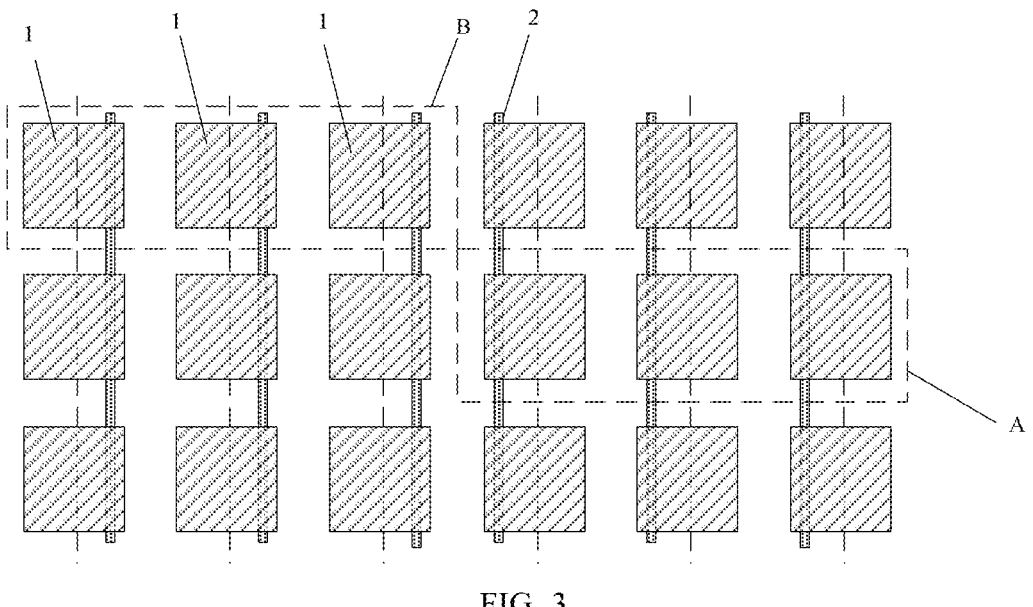
FIG. 3 is a schematic diagram of an array substrate according to an embodiment of the present disclosure.
Figure 4:
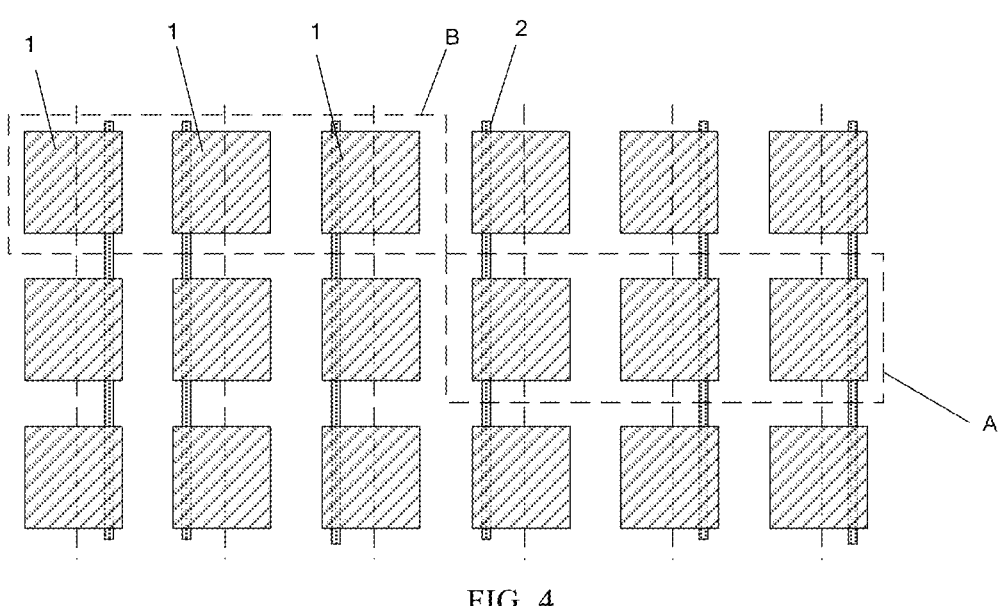
FIG. 4 is a schematic diagram of another array substrate according to an embodiment of the present disclosure.

In some embodiments, the signal lines 2 may be disposed along the second direction (refer to a vertical direction in FIGS. 3 and 4). All pixel regions may be arranged in an array. As shown in FIG. 3 and FIG. 4, the second direction may be the same direction as a column direction of the array in which the pixel regions are arranged, or the second direction may also be other direction. The signal line 2 may include a data line configured to provide a data signal to a light-emitting control unit to control light emission of the light-emitting unit. Alternatively, the pixel regions may not be arranged in an array, but be arranged in other manner.

It should be noted that, in the embodiments, the signal line 2 in the sub-pixel 1 refers to a corresponding signal line segment whose projection on the base substrate overlaps the projection of the sub-pixel 1 on the base substrate, and does not specifically refer to a complete signal line. A plurality of signal lines (signal line segments) 2 configured to transmit a same electrical signal and in a plurality of sub-pixels 1 at a same position (e.g., on a same column) in the second direction may be connected to be a single-piece structure, i.e., regarded as one long complete signal line. In a same sub-pixel 1, the projections of the signal line 2 and the light-emitting unit on the base substrate do not necessarily overlap each other, that is, the signal line 2 is not necessarily located below the light-emitting unit. However, it could be understood that no matter whether the signal line 2 is located below the light-emitting unit or not, within a limited area in the same sub-pixel 1, a setting deviation of the signal line 2 will inevitably have certain influence on flatness of a light-emitting surface of the light-emitting unit. Meanwhile, the closer the signal line 2 to the center of the light-emitting unit is, the smaller the influence on the inclination of the light-emitting surface is. Therefore, in some embodiments, in the same sub-pixel 1, the projection of the signal line 2 on the base substrate overlaps the projection of the light-emitting unit on the base substrate. In some embodiments, in a same sub-pixel of the first light-emitting color, a distance between the signal line 2 and the virtual center line in the first direction may be determined according to a size of the sub-pixel 1 in an actual situation. It could be understood that the smaller the distance between the signal line 2 and the virtual center line is, the more symmetrical the color shift of the sub-pixel 1 under a large view angle is. However, due to the existence of a connection via hole, the signal line 2 cannot be disposed on the virtual center line. However, if conditions permit, the signal line 2 may be disposed as close to the virtual center line as possible, so as to reduce color shift asymmetry of a single sub-pixel 1 itself under a large view angle.

Figure 5:
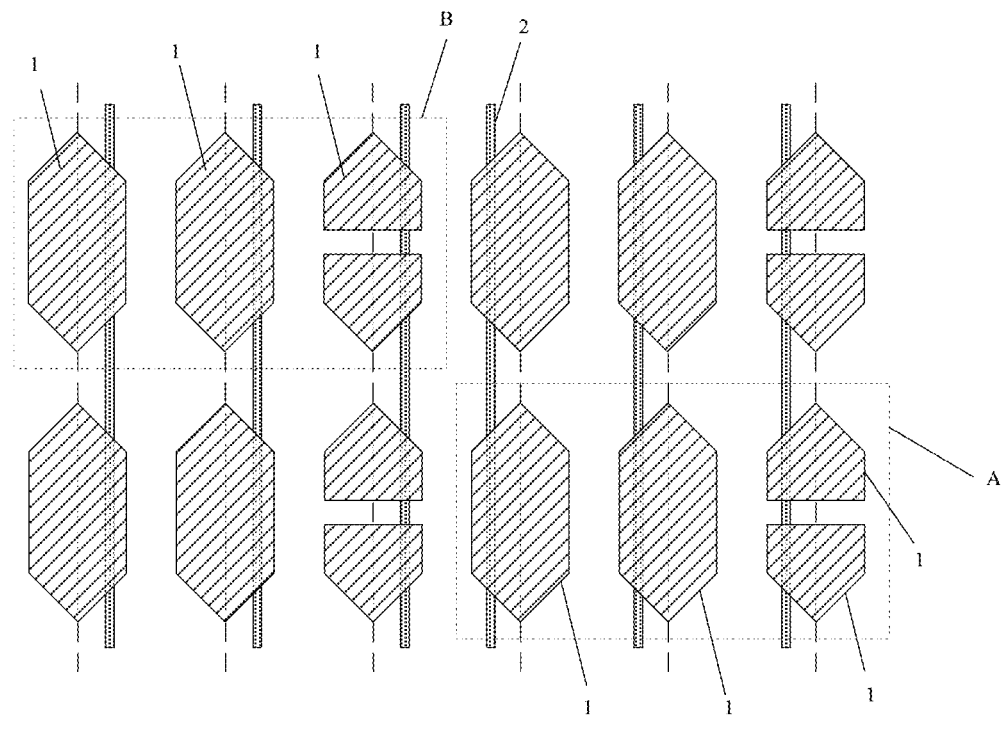
FIG. 5 is a schematic diagram of another array substrate according to an embodiment of the present disclosure.
Figure 6:
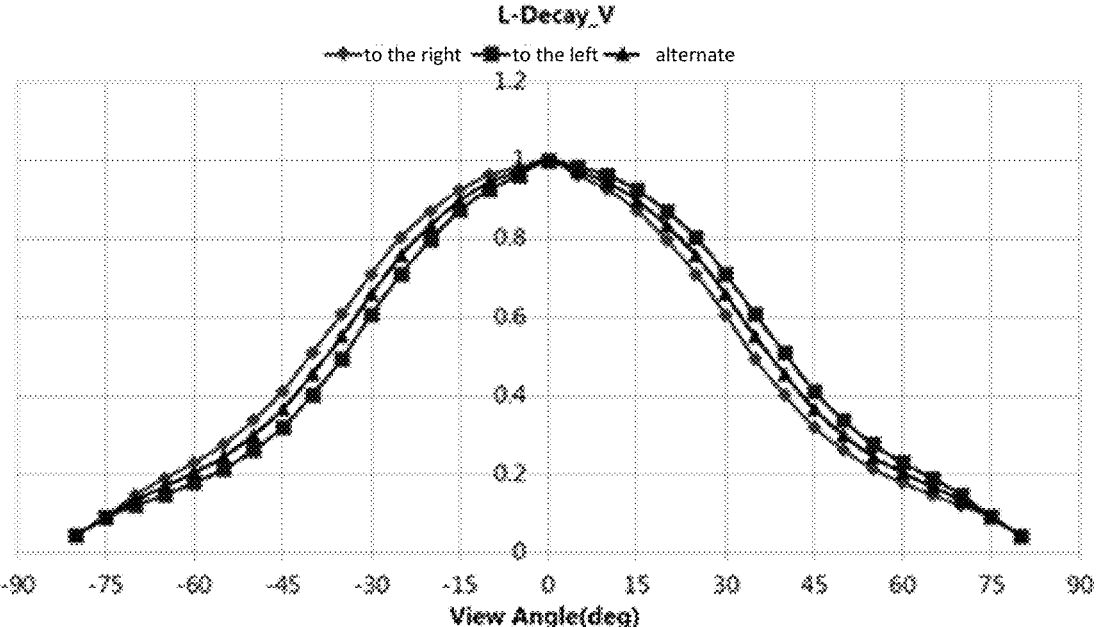
FIG. 6 is a schematic diagram illustrating white light color shift trajectories of sub-pixels of a first light-emitting color of array substrates with different arrangements of pixel regions according to the present disclosure.
Figure 7:
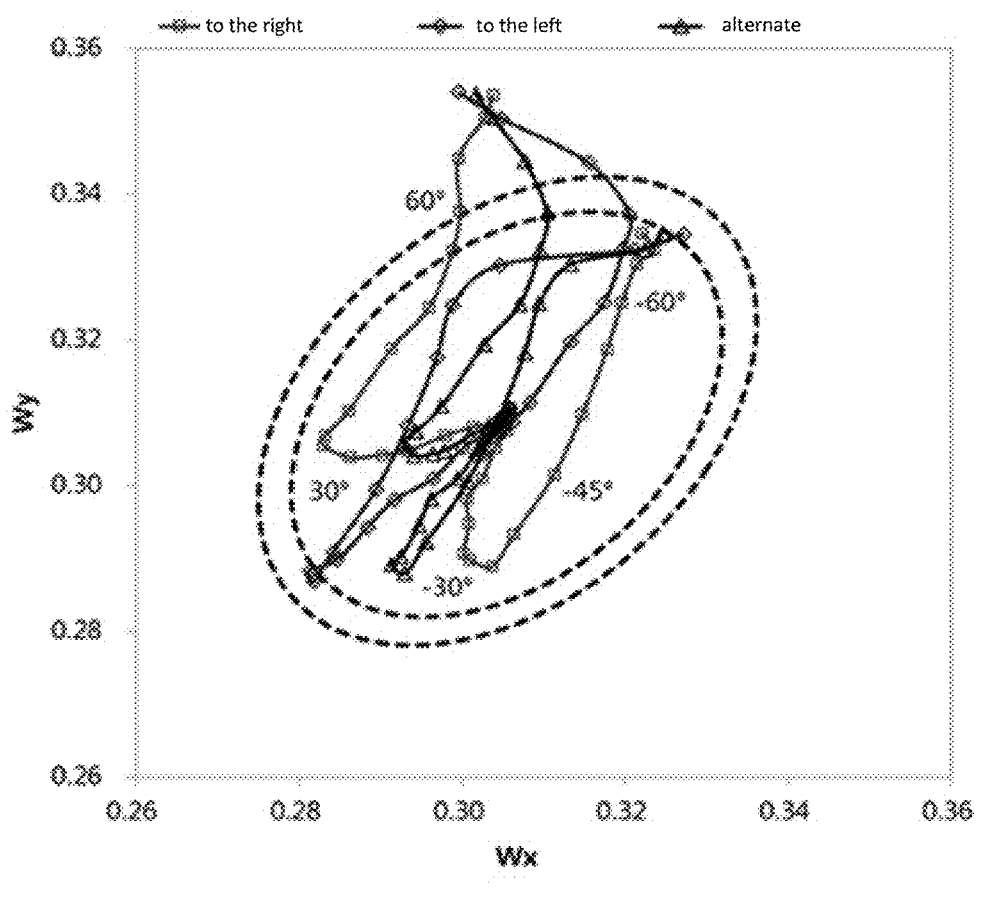
FIG. 7 is a schematic diagram illustrating white light color shift trajectories of sub-pixels of a first light-emitting color of array substrates with different arrangements of pixel regions according to the present disclosure.
Figure 8:
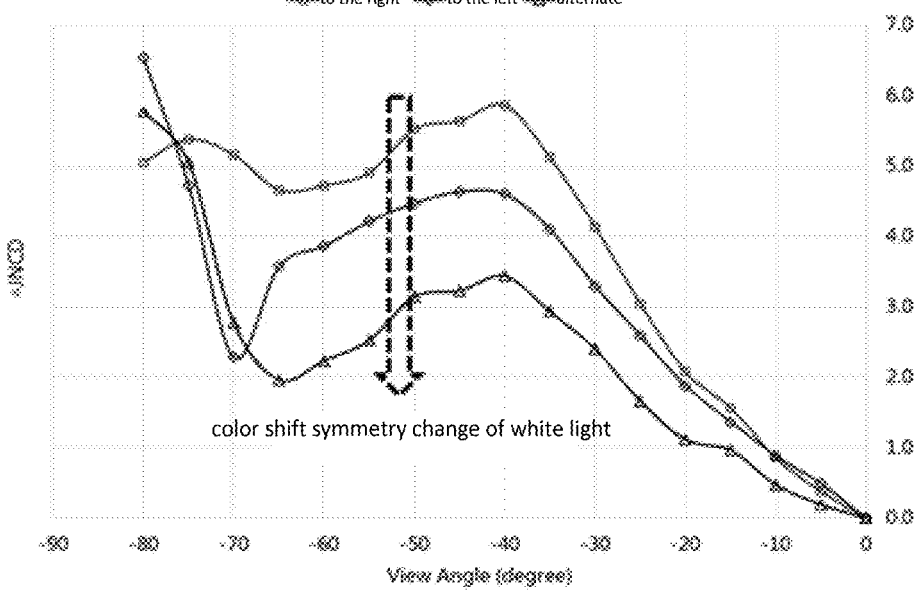
FIG. 8 is a graph illustrating luminance decay curves of sub-pixels of two light-emitting colors of array substrates with different arrangements of pixel regions under different view angles according to the present disclosure.

In some embodiments, in a same sub-pixel of the first light-emitting color, the first area and the second area are substantially symmetrical with respect to the virtual center line. The virtual center line passes through the center point of the light-emitting unit, and when the first area and the second area are symmetrical with respect to the virtual center line, as shown in FIG. 5, in a direction perpendicular to the extending direction of the virtual center line, the color shift asymmetry of a sub-pixel of the first light-emitting color whose signal line is located in the first area and the color shift asymmetry of a sub-pixel of the first light-emitting color whose signal line is located in the second area are mutually complementary. That is, a change in luminance decay, on the left side of the virtual center line, of a sub-pixel of the first light-emitting color located in the first pixel region A is substantially the same as a change in luminance decay, on the right side of the virtual center line, of a sub-pixel of the first light-emitting color located in the second pixel region B, and a change in luminance decay, on the right side of the virtual center line, of the sub-pixel of the first light-emitting color located in the first pixel region A is substantially the same as a change in luminance decay, on the left side of the virtual center line, of the sub-pixel of the first light-emitting color located in the second pixel region B. In this case, in the sub-pixels of the first light-emitting color in adjacent two pixel regions, the signal lines 2 in one pixel region are respectively located in the first areas, and the signal lines 2 in the other pixel region are respectively located in the second areas, so that complementarity of the luminance decay can be realized through effective utilization of luminance decay change characteristics in the two pixel regions, and luminance decay trend asymmetry in the two pixel regions under a large view angle in the first direction is eliminated.

In some embodiments, the signal lines 2 of the sub-pixels of the first light-emitting color in two adjacent pixel regions are arranged in a mirror-image manner, and a central axis of the mirror-image arrangement passes through a center of the two adjacent pixel regions. That is to say, the arrangement of the signal lines 2 in the sub-pixels of the first light-emitting color in the two adjacent pixel regions is symmetrical with respect to a line passing through the center (which may also be referred to as a center line) of the two adjacent pixel regions. In this case, the influences of the signal lines 2 on the inclination degrees of the light-emitting surfaces of the light-emitting units are opposite to each other in the first direction, which facilitates weakening asymmetry of the sub-pixels of the first light-emitting color in the adjacent two pixel regions under a large view angle. The arrangement of the signal lines 2 includes one or more of parameters such as a distance between signal lines 2, a width and a shape of each of the signal lines 2, and a distance between each signal line 2 and the virtual center line of the sub-pixel 1 where the signal line 2 is located.

Further, the light-emitting units of the sub-pixels of the first light-emitting color in two adjacent pixel regions are arranged in a mirror-image manner, and a central axis of the mirror-image arrangement passes through the center of the two adjacent pixel regions. The arrangement of the light-emitting units includes a shape and a size of each of the light-emitting units. On this basis, the signal lines 2 and the light-emitting units of the sub-pixels of the first light-emitting color in two adjacent pixel regions are both arranged a mirror-image manner in the first direction with respect to the center line of the two adjacent pixel regions. Therefore, the decay change characteristics of the sub-pixels of the first light-emitting color in the two adjacent pixel regions can be mirror-symmetrical in the first direction, that is, complementarity of the luminance decay can be achieved, and then the luminance decay trend asymmetry in the two adjacent pixel regions under a large view angle in the first direction is eliminated.

In some embodiments, the plurality of pixel regions include a plurality of first pixel regions A and a plurality of second pixel regions B arranged along the first direction. The plurality of first pixel regions A and the plurality of second pixel regions B are arranged alternately in the first direction. When the array substrate performs image display, a user's perception of the color shift asymmetry under a large view angle is an overall perception of a display picture of the array substrate, rather than a certain pixel region. By arranging the first pixel regions A and the second pixel regions B alternately in the first direction, pixel regions with different luminance decays can be distributed alternately in the first direction, so that correction of the color shift asymmetry in the first direction is more uniform and the user experience is improved.

In some embodiments, the plurality of pixel regions are arranged in an array. In a row direction, at least one first pixel region A is adjacent to at least one second pixel region B. In one column of pixel regions, all pixel regions are a plurality of first pixel regions A, or are a plurality of second pixel regions B. Referring to FIG. 3 and FIG. 4, the signal line 2 extends in the same direction as a column direction of the array of the pixel regions. In this case, the color shift asymmetry between the first pixel region A and the second pixel region B under a large view angle in the row direction is most obvious. By making the first pixel region A and the second pixel region B adjacent to each other in the row direction, the luminance decay changes of the sub-pixels of the first light-emitting color in the adjacent two pixel regions in the row direction are complementary, and further the luminance decay trend asymmetry in the two pixel regions under a large view angle in the row direction is significantly weakened or even eliminated. In the column direction, the sub-pixels of the first light-emitting color in a same column may be controlled by a same signal line 2. In order to simplify the shape design of the signal line 2, the signal line 2 may extend straightly in the column direction, and pixel regions of a same type may be arranged in a column.

In some embodiments, the plurality of pixel regions are arranged in an array; in a row direction, at least one first pixel region A is adjacent to at least one second pixel region B; in a column direction, at least one first pixel region A is adjacent to at least one second pixel region B. Referring to FIG. 3 and FIG. 4, the signal line 2 extends in the same direction as the column direction of the array of the pixel regions. In this case, the color shift asymmetry between the first pixel region A and the second pixel region B under a large view angle in the row direction is most obvious. By making the first pixel region A and the second pixel region B adjacent to each other in the row direction, the luminance decay changes of the sub-pixels of the first light-emitting color in the adjacent two pixel regions in the row direction are complementary, and further the luminance decay trend asymmetry in the two pixel regions under a large view angle in the row direction is significantly weakened or even eliminated. In the column direction, the color shift asymmetry between the first pixel region A and the second pixel region B at a large view angle may also exist. By making the first pixel region A and the second pixel region B adjacent to each other in the column direction, the luminance decay changes of the sub-pixels of the first light-emitting color in the adjacent two pixel regions in the column direction are also complementary, further occurrence of luminance decay trend asymmetry in the two pixel regions under a large view angle in the column direction is avoided, thereby avoiding the luminance decay trend asymmetry at a large view angle in each direction to the greatest extent. In order to make the first pixel region A and the second pixel region B adjacent to each other in the column direction, positional relationship between the sub-pixels of the first light-emitting color and the signal lines 2 may be adjusted appropriately. In an embodiment, the sub-pixels of the first light-emitting color may be arranged in an array, and a pattern of a signal line 2 may be adjusted. For example, the signal line 2 may be designed to be S-shaped and extend in the column direction; alternatively, the signal line is I-shaped in the column direction, and sub-pixels of the first light-emitting color in a same column are set to the left or right alternately. It could be understood that the positional relationship between the sub-pixels of the first light-emitting color and the signal lines 2 may also be adjusted in other setting way, as long as the above features are satisfied.

In some embodiments, in a same pixel region, at least some of the sub-pixels 1 have different light-emitting colors. Referring to FIGS. 3 to 5, a plurality of pixels constitute one pixel region. Each pixel region may include sub-pixels 1 of a same light-emitting color or of different light-emitting colors.

In some embodiments, the light-emitting colors of a sub-pixels 1 include: one or more of red, green, and blue. In a case where the sub-pixels 1 in the pixel region have three light-emitting colors of red, green and blue, display of various colors can be realized. Referring to FIG. 3, a pixel region includes sub-pixels 1 of three light-emitting colors, which are a sub-pixel of a first light-emitting color, a sub-pixel of a second light-emitting color, and a sub-pixel of a third light-emitting color. In a case where a pixel region includes the sub-pixels 1 of the above three light-emitting colors, and only the sub-pixels of the first light-emitting color in the array substrate satisfy that the projections of the signal lines 2 of a part of the sub-pixels of the first light-emitting color on the base substrate fall into the projections of the first areas of the part of the sub-pixels of the first light-emitting color on the base substrate, and the projections of the signal lines 2 of other part of the sub-pixels of the first light-emitting color fall into the projections of the second areas of the other part of the sub-pixels of the first light-emitting color on the base substrate, the color shift asymmetry of the array substrate can be weakened. Meanwhile, referring to FIG. 7 and FIG. 8, when the array substrate displays a white picture, a color shift trajectory under a large view angle is also significantly improved. For the sub-pixels 1 of the other two colors (i.e., the sub-pixels of the second light-emitting color and the sub-pixels of the third light-emitting color), an arrangement of the signal lines 2 therein may be similar to the arrangement of the signal lines 2 in the sub-pixels 1 of the first light-emitting color. It should be noted that, in a same pixel region, areas where the signal lines 2 of the sub-pixels of the second light-emitting color and the sub-pixels of the third light-emitting color are arranged are not necessarily the same as that in the sub-pixels of the first light-emitting color.

In some embodiments, referring to FIG. 4, in the first pixel region A, the projection of the signal line 2 in the sub-pixel of the first light-emitting color on the base substrate falls into the projection of the first area on the base substrate, the projection of the signal line 2 of the sub-pixel of the second light-emitting color on the base substrate may fall into the projection of the second area of the sub-pixel of the second light-emitting color on the base substrate, and the projection of the signal line 2 of the sub-pixel of the third light-emitting color on the base substrate may fall into the projection of the second area of the sub-pixel of the third light-emitting color on the base substrate; and in the second pixel region B, the projection of the signal line 2 in the sub-pixel of the first light-emitting color on the base substrate falls into the projection of the second area on the base substrate, the projection of the signal line 2 of the sub-pixel of the second light-emitting color on the base substrate may fall into the projection of the first area of the sub-pixel of the second light-emitting color on the base substrate, and the projection of the signal line 2 of the sub-pixel of the third light-emitting color on the base substrate may fall into the projection of the first area of the sub-pixel of the third light-emitting color on the base substrate. Alternatively, in some other embodiments, in the first pixel region A, the projection of the signal line 2 in the sub-pixel of the first light-emitting color on the base substrate falls into the projection of the first area on the base substrate, the projection of the signal line 2 of the sub-pixel of the second light-emitting color on the base substrate may fall into the projection of the first area of the sub-pixel of the second light-emitting color on the base substrate, and the projection of the signal line 2 of the sub-pixel of the third light-emitting color on the base substrate may fall into the projection of the second area of the sub-pixel of the third light-emitting color on the base substrate; and in the second pixel region B, the projection of the signal line 2 in the sub-pixel of the first light-emitting color on the base substrate falls into the projection of the second area on the base substrate, the projection of the signal line 2 of the sub-pixel of the second light-emitting color on the base substrate may fall into the projection of the second area of the sub-pixel of the second light-emitting color on the base substrate, and the projection of the signal line 2 of the sub-pixel of the third light-emitting color on the base substrate may fall into the projection of the first area of the sub-pixel of the third light-emitting color on the base substrate.

Figure 9:
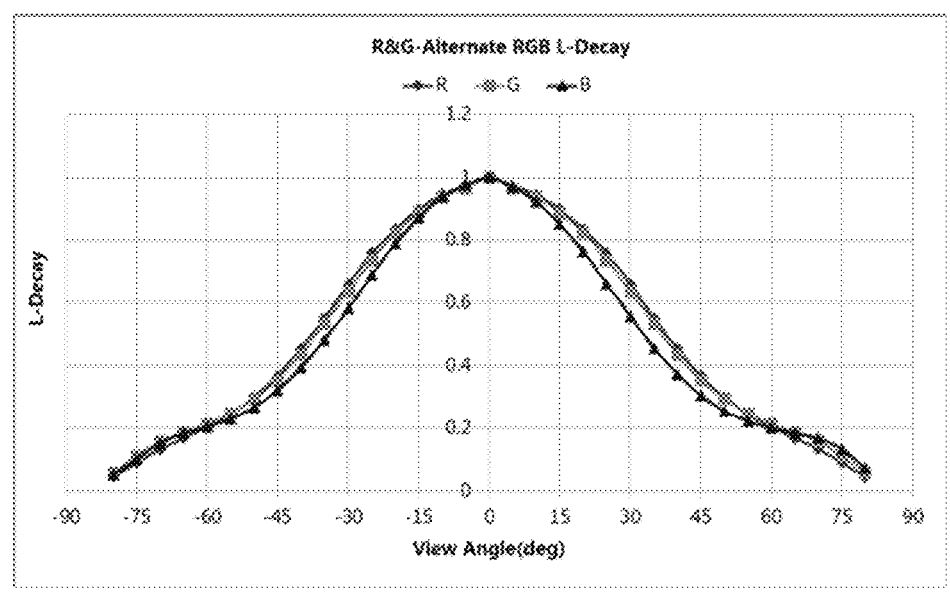
FIG. 9 a schematic diagram illustrating white light color shift trajectories of sub-pixels of two light-emitting colors of array substrates with different arrangements of pixel regions according to the present disclosure.
Figure 10:
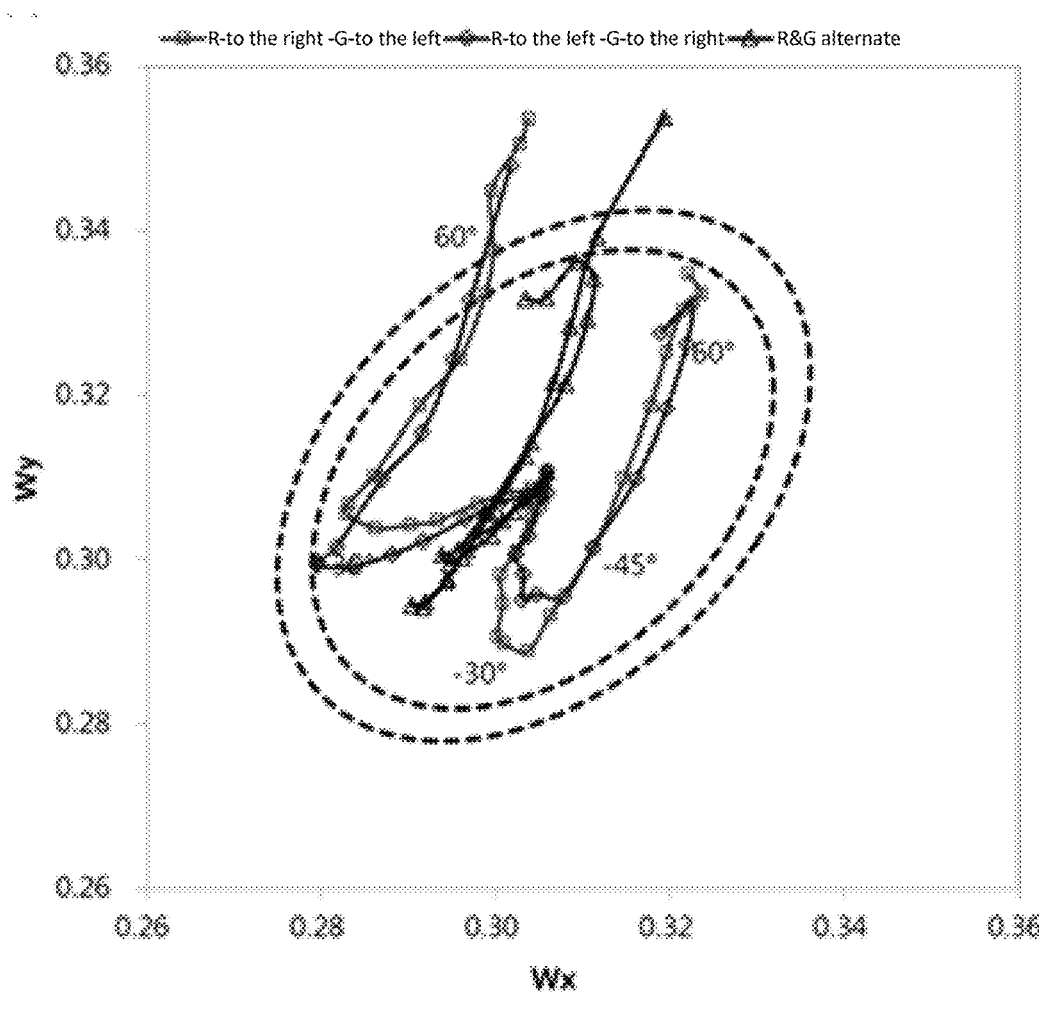
FIG. 10 is a schematic diagram illustrating an influence on white light color shift symmetry of sub-pixels of two light-emitting colors of array substrates with different arrangements of pixel regions according to the present disclosure.

In some embodiments, each pixel region includes a plurality of sub-pixels 1. The projections of the signal lines 2 of the plurality of sub-pixels 1 in a same pixel region on the base substrate all fall into the projections on the base substrate of the first areas of the sub-pixels 1 in which the signal lines 2 are located. Alternatively, the projections of the signal lines 2 of the plurality of sub-pixels 1 in a same pixel region on the base substrate all fall into the projections on the base substrate of the second areas of the sub-pixels 1 in which the signal lines 2 are located. That is to say, the signal line 2 of each sub-pixel 1 in the pixel region is arranged in the same manner as the signal line 2 of the sub-pixel of the first light-emitting color. Referring to FIGS. 3 to 5, a plurality of pixels constitute one pixel region. Each pixel region may include sub-pixels 1 of a same light-emitting color or different light-emitting colors. In the first pixel region A, the projection of the signal line 2 of each sub-pixel 1 (e.g., the sub-pixel of the first light-emitting color, the sub-pixel of the second light-emitting color, or the sub-pixel of the third light-emitting color) on the base substrate falls into the projection of the first area of the sub-pixel 1 on the base substrate, and in the second pixel region B, the projection of the signal line 2 of each sub-pixel 1 on the base substrate falls into the projection of the second area of the sub-pixel 1 on the base substrate. Referring to FIGS. 5 and 9 to 10, experimental data shows that when the signal lines 2 of all sub-pixels 1 in a single pixel region are located in areas of a same type (i.e., all in the first areas or all in the second areas), and the first pixel regions and the second pixel regions are alternately arranged in the first direction, it is more beneficial to weakening the color shift asymmetry of white light of the entire array substrate.

In some embodiments, the light-emitting unit includes an OLED light-emitting device. In this case, the light-emitting unit may include a first electrode 11, an organic light-emitting layer 12 and a second electrode 13 that are sequentially disposed in a direction away from the base substrate. The first electrode 11 is located on a planarization layer, and is connected to the signal line 2 under the planarization layer through a via hole in the planarization layer. Different sub-pixels 1 are defined by a pixel definition layer 14. For example, the pixel definition layer (PDL) is disposed on the planarization layer, and is located on a plane where the first electrode 11 is located. An accommodating portion of the pixel definition layer 14 exposes the first electrode 11 and accommodates the organic light-emitting layer 12 therein. A material of the first electrode 11 may include a conductive material such as a metal, a metal alloy, a metal nitride, a conductive metal oxide, and a transparent conductive material. A material of the pixel definition layer may include an organic material or an inorganic material. The organic light-emitting layer 12 may include a light-emitting layer. A material of the light-emitting layer may include a small molecule organic material or a polymer molecular organic material, may be a fluorescent light-emitting material or a phosphorescent light-emitting material, may emit red light, green light, blue light, or may emit white light. Further, as required, the organic light-emitting layer 12 may further include a hole injection layer, a hole transport layer, an electron injection layer, an electron transport layer, and the like. A material of the second electrode 13 may include a conductive material, which, for example, may include a metal, a metal alloy, a metal nitride, a conductive metal oxide, a transparent conductive material, or the like. In some embodiments of the present disclosure, the light-emitting unit may include a top-emission OLED light-emitting device (e.g., a top-emission OLED), and the first electrode 11 may also serve as a reflective structure. In this case, the first electrode 11 may include a conductive material with light-reflecting properties or include a light-reflecting film. The second electrode 13 includes a semitransparent conductive material, in this case, the second electrode 13 also serves as a transflective structure, and the OLED light-emitting device does not need to be additionally provided with a transflective structure.

In some embodiments, the array substrate further includes the pixel definition layer 14, the pixel definition layer 14 includes a plurality of openings (i.e., accommodating portions), each sub-pixel 1 corresponds to one opening of the pixel definition layer 14, and different sub-pixels 1 are defined by the pixel definition layer 14. For example, the pixel definition layer is disposed on the planarization layer, and is located on the plane where the first electrode 11 is located. Each accommodating portion of the pixel definition layer 14 exposes a corresponding first electrode 11 and accommodates a corresponding organic light-emitting layer 12 therein. A shape of a light-emitting area of each sub-pixel 1 is substantially the same as a shape of the corresponding opening of the pixel definition layer.

In some embodiments, the light-emitting areas of at least some of the sub-pixels 1 are in an axisymmetric shape. In a case where the light-emitting area of a sub-pixel 1 is in an axisymmetric shape, a symmetry axis of the light-emitting area of the sub-pixel 1 overlaps the virtual center line of the sub-pixel 1. In this case, the first area and the second area of the sub-pixel 1 are located on two sides of the symmetry axis of the light-emitting area of the sub-pixel 1, respectively, and an influence of the signal line 2 in the first area on the color shift of the sub-pixel 1 under a large view angle and an influence of the signal line 2 in the second area on the color shift of the sub-pixel 1 are also relatively symmetrical. In a case where the light-emitting areas of the sub-pixels 1 in the first pixel region A and the second pixel region B that are adjacent to each other are all in a same axisymmetric shape, the color shift trajectory of the two pixel regions under a large view angle can be further improved. That is to say, by designing each of the shapes of the light-emitting areas of the sub-pixels 1 as an axisymmetric pattern, it is more conducive to weakening the color deviation problem of the entire array substrate under a large view angle. In some embodiments, each of the shapes of the sub-pixels 1 includes at least one of a quadrangle, a pentagon, a hexagon, an octagon, a circle, and an ellipse. It could be understood that, in a same pixel region, the shapes of different sub-pixels 1 may be the same or different. However, in different pixel regions, the sub-pixels of a same light-emitting color should have a same shape, so that light emission of every pixel region on the array substrate is overall uniform, and an influence on image display of the array substrate is avoided.

In some embodiments, a material of the planarization layer may include an organic insulating material, and the organic insulating material includes, for example, polyimide, epoxy resin, acrylic, polyester, photoresist, polyacrylate, polyamide, siloxane, or other resin material. For another example, the organic insulating material includes an elastic material, such as ethyl carbamate, thermoplastic polyurethane (TPU), etc.

In some embodiments, the base substrate may be a flexible substrate or a rigid substrate. In a case where the base substrate is a flexible substrate, polyimide, polycarbonate, polyacrylate, polyetherimide, polyethersulfone, polyethylene terephthalate, polyethylene naphthalate, or other resin material may be used. In a case where the base substrate is a rigid substrate, its material may include glass or the like.

In another aspect, an embodiment of the present disclosure further provides a display panel including any one of the above array substrates. In some embodiments, the display panel may be a liquid crystal display panel or an organic light-emitting diode display panel, and specifically is any product or component with a display function such as a liquid crystal panel, an OLED panel, a MicroLED panel, a MiniLED panel, a mobile phone, a tablet computer, a television, a monitor, a notebook computer, a digital photo frame, a navigator, or the like.

It should be noted that, relational terms such as first, second and the like herein are used only to distinguish one entity or operation from another entity or operation, and do not necessarily require or imply existence of any actual relationship or sequence between these entities or operations. Moreover, terms "include", "comprise" or any other variation thereof are intended to encompass non-exclusive inclusion such that a process, method, item or device comprising a list of elements includes not only those elements, but also includes other element(s) not explicitly listed or inherent to the process, method, item or device. Without further limitation, an element limited by a phrase "comprising a . . . " does not preclude the presence of additional identical element(s) in the process, method, item, or device that includes the element.

Embodiments in accordance with the present disclosure are described above, which do not exhaust all the details, and the present disclosure is not limited to only the specific embodiments described. Obviously, many modifications and variations may be made based on the above description. These embodiments are selected and described in detail in the specification in order to better explain the principles and practical applications of the present disclosure, so that those skilled in the art can make good use of the present disclosure and modifications based on the present disclosure. The present disclosure is only limited by the claims and full scope and equivalents thereof.

What is claimed is:

1. An array substrate, comprising a plurality of pixel regions each comprising at least one sub-pixel; the at least one sub-pixel each comprising: a light-emitting unit on a base substrate and only one data line overlapping with the light-emitting unit in a direction perpendicular to the base substrate; the data line extending along a second direction; the light-emitting unit comprising a first electrode; and the data line being on a side of the first electrode proximal to base substrate; wherein the plurality of pixel regions comprise at least one first pixel region and at least one second pixel region that are adjacent to each other along a first direction; the at least one sub-pixel at least comprises a sub-pixel of a first light-emitting color;

each sub-pixel comprises a first area and a second area respectively on two sides of a virtual center line; the virtual center line passes through a center of the light-emitting unit in the first direction and extends along the second direction; the first area and the second area in every sub-pixel are arranged in the same manner;

in a sub-pixel of the first light-emitting color of the at least one first pixel region, at least a part of a projection of at least one data line on the base substrate falls into a projection of the first area on the base substrate; and in a sub-pixel of the first light-emitting color of the at least one second pixel region, at least a part of a projection of at least one data line on the base substrate falls into a projection of the second area on the base substrate.

2. The array substrate of claim 1, wherein in a same sub-pixel, the projection of the data line on the base substrate overlaps a projection of the light-emitting unit on the base substrate.

3. The array substrate of claim 1, wherein the sub-pixel further comprises a driving unit on the base substrate; in a same sub-pixel, the data line is connected to the driving unit, and the driving unit is configured to drive the light-emitting unit to emit light.

4. The array substrate of claim 1, wherein in a same sub-pixel, the first area and the second area are substantially symmetrical with respect to the virtual center line.

5. The array substrate of claim 1, wherein data lines of sub-pixels of the first light-emitting color of two adjacent pixel regions are arranged in a mirror-image manner with respect to a center of the two adjacent pixel regions.

6. The array substrate of claim 5, wherein the light-emitting units of the sub-pixels of the first light-emitting color in the two adjacent pixel regions are arranged in a mirror-image manner with respect to the center of the two adjacent pixel regions.

7. The array substrate of claim 1, wherein the plurality of pixel regions comprise a plurality of first pixel regions and a plurality of second pixel regions arranged along a first direction; and the plurality of first pixel regions and the plurality of second pixel regions are arranged alternately in the first direction.

8. The array substrate of claim 1, wherein the plurality of pixel regions are arranged in an array;

in a row direction, at least one first pixel region is adjacent to at least one second pixel region; and pixel regions in one column are all first pixel regions or all second pixel regions.

9. The array substrate of claim 1, wherein the plurality of pixel regions are arranged in an array;

in a row direction, at least one first pixel region is adjacent to at least one second pixel region; and in a column direction, at least one first pixel region is adjacent to at least one second pixel region.

10. The array substrate of claim 1, wherein each pixel region comprises a plurality of sub-pixels; and in a same pixel region, at least some of the plurality of sub-pixels have different light-emitting colors.

11. The array substrate of claim 10, wherein the projections of the data lines of the plurality of sub-pixels in a same pixel region on the base substrate fall into the projections of the first areas of the plurality of sub-pixels on the base substrate, respectively; or the projections of the data lines of the plurality of sub-pixels in a same pixel region on the base substrate fall into the projections of the second areas of the plurality of sub-pixels on the base substrate, respectively.

12. The array substrate of claim 11, wherein light-emitting colors of the plurality of sub-pixels comprise: one or more of red, green, and blue.

13. The array substrate of claim 11, wherein a shape of a light-emitting area of each of at least some of the plurality of sub-pixels comprises an axisymmetric pattern symmetrical with respect to the virtual center line.

14. The array substrate of claim 13, wherein the shape of the light-emitting area of each sub-pixel comprises at least one of a quadrangle, a pentagon, a hexagon, an octagon, a circle, and an ellipse.

15. The array substrate of claim 1, wherein the light-emitting unit comprises a top-emission OLED light-emitting device.

16. The array substrate of claim 15, wherein the top-emission OLED light-emitting device comprises: the first electrode, an organic light-emitting layer, and a second electrode arranged in sequence along a direction away from the base substrate, and a transflective structure on a side of the second electrode distal to the base substrate.

17. The array substrate of claim 16, wherein the top-emission OLED light-emitting device further comprises: a reflective structure on a side of the organic light-emitting layer proximal to the base substrate; and the reflective structure and the first electrode are of a single-piece structure.

18. A display panel, comprising the array substrate of claim 1.

* * * * *